United States Patent
Yang

(10) Patent No.: US 10,785,894 B2
(45) Date of Patent: Sep. 22, 2020

(54) CASE HEAT DISSIPATION UNIT OF HANDHELD ELECTRONIC DEVICE

(71) Applicant: ASIA VITAL COMPONENTS CO., LTD., New Taipei (TW)

(72) Inventor: Hsiu-Wei Yang, New Taipei (TW)

(73) Assignee: Asia Vital Components Co., Ltd., New Taipei (TW)

( * ) Notice: Subject to any disclaimer, the term of this patent is extended or adjusted under 35 U.S.C. 154(b) by 0 days.

(21) Appl. No.: 16/033,170

(22) Filed: Jul. 11, 2018

(65) Prior Publication Data

US 2018/0376619 A1 Dec. 27, 2018

Related U.S. Application Data

(63) Continuation-in-part of application No. 14/103,000, filed on Dec. 11, 2013, now Pat. No. 10,101,779.

(51) Int. Cl.
| | |
|---|---|
| *H05K 7/20* | (2006.01) |
| *H04B 1/036* | (2006.01) |
| *H04B 1/3888* | (2015.01) |
| *G06F 1/20* | (2006.01) |
| *H04M 1/02* | (2006.01) |
| *F28F 21/04* | (2006.01) |
| *F28F 21/08* | (2006.01) |
| *F28D 21/00* | (2006.01) |

(52) U.S. Cl.
CPC ......... *H05K 7/20509* (2013.01); *G06F 1/203* (2013.01); *H04B 1/036* (2013.01); *H04B 1/3888* (2013.01); *H04M 1/0202* (2013.01); *F28D 2021/0029* (2013.01); *F28F 21/04* (2013.01); *F28F 21/083* (2013.01); *F28F 21/086* (2013.01); *G06F 1/20* (2013.01); *G06F 2200/1633* (2013.01); *H04M 1/026* (2013.01)

(58) Field of Classification Search
CPC ..... H05K 7/20509; F28F 21/04; F28F 21/086
USPC .................................. 361/679.54, 702, 720
See application file for complete search history.

(56) References Cited

U.S. PATENT DOCUMENTS

| | | | | |
|---|---|---|---|---|
| 7,768,457 | B2 * | 8/2010 | Pettus | H01L 23/66 343/700 MS |
| 7,778,044 | B2 * | 8/2010 | Inaba | H03J 1/00 174/520 |
| 8,481,126 | B2 * | 7/2013 | Wang | B32B 15/04 427/190 |
| 2007/0127223 | A1 * | 6/2007 | Mitsuhashi | G06K 19/07732 361/752 |
| 2014/0126135 | A1 * | 5/2014 | Abbatiello | B29C 70/68 361/679.31 |

(Continued)

*Primary Examiner* — Mukundbhai G Patel
(74) *Attorney, Agent, or Firm* — Thomas J. Nikolai; DeWitt LLP

(57) ABSTRACT

A case heat dissipation unit of handheld electronic device includes a back cover including a ceramic layer. A titanium metal layer or a stainless steel metal layer is disposed on the ceramic layer in a position corresponding to at least one heat source. The ceramic layer is an outer surface of the handheld electronic device and exposed to an external environment. The titanium metal layer or the stainless steel metal layer faces a receiving space of the handheld electronic device in contact with the heat source in the receiving space. The titanium metal layer or the stainless steel metal layer serves to absorb the heat generated by the heat source and transfer the heat to the ceramic layer for dissipating the heat.

4 Claims, 4 Drawing Sheets

(56) References Cited

U.S. PATENT DOCUMENTS

2014/0168898 A1\* 6/2014 Xu ..................... H01L 23/3731
361/705

\* cited by examiner

CASE HEAT DISSIPATION UNIT OF HANDHELD ELECTRONIC DEVICE

The present application is a continuation in part of U.S. patent application Ser. No. 14/103,000, filed on Dec. 11, 2013.

BACKGROUND OF THE INVENTION

1. Field of the Invention

The present invention relates generally to heat dissipation field, and more particularly to a case heat dissipation unit of handheld electronic device.

2. Description of the Related Art

A handheld electronic device is a sort of portable electronic device, which can be readily and conveniently operated and used by a user. Along with the progressive increase of the arrangement density of the components of the electronic device, the volume of the electronic device has become smaller and smaller and the weight of the electronic device has become lighter and lighter. As a result, along with the minimization of the size of the electronic device, the heat dissipation problem of the electronic device has become a critical issue bothering the product designer, especially in the field of handheld electronic device.

The case of a common handheld electronic device on the market is generally made of plastic material. The handheld electronic device has a quite small volume so that the size of the electronic components in the device is miniaturized. In this case, it is hard to conduct out the heat generated by the electronic components so that it is difficult to dissipate the heat of the handheld electronic device. As a result, the electronic components in the electronic device often fail due to overheating to shorten the lifetime of the electronic device or deteriorate the performance of the electronic device.

In addition, some manufacturers in this field manufacture the case of the handheld electronic device from a great amount of metal as the main material of the case, especially aluminum/magnesium alloy. This is because aluminum/magnesium alloy has light weight and higher strength as well as excellent appearance. Aluminum/magnesium alloy has almost become the major material of the case of the new generation handheld electronic device. However, the aluminum/magnesium alloy-made case of the handheld electronic device simply has a more beautiful appearance than the common plastic-made case, while the aluminum/magnesium alloy-made case still has no heat dissipation effect so that the heat in the case is still hard to dissipate. Under such circumstance, the lifetime of the electronic components in the case will be still shortened due to overheating. Furthermore, the aluminum/magnesium alloy-made case will shield the antenna from the signal and affect the signal receiving ability of the antenna so that the aluminum/magnesium alloy-made case cannot satisfy the layout requirement of the antenna structure.

SUMMARY OF THE INVENTION

It is therefore a primary object of the present invention to provide a case heat dissipation unit of handheld electronic device, which can efficiently conduct the heat generated by the handheld electronic device to outer side of the case for dissipating the heat. In addition, the case heat dissipation unit of handheld electronic device can satisfy the layout requirement of the antenna structure of the handheld electronic device.

It is a further object of the present invention to provide the above case heat dissipation unit of handheld electronic device, which includes a back cover as the case of the handheld electronic device. The back cover has a ceramic layer. A titanium metal layer or a stainless steel metal layer is disposed on the ceramic layer in a position corresponding to at least one heat source. The ceramic layer enhances the impact-resistance of the back cover and makes the back cover durable and uneasy to crack. Also, the back cover with the ceramic layer and the titanium metal layer or stainless steel metal layer serves as a heat dissipation path of the electronic components inside the handheld electronic device.

To achieve the above and other objects, the case heat dissipation unit of handheld electronic device includes a back cover including a ceramic layer. A titanium metal layer or a stainless steel metal layer is disposed on the ceramic layer in a position corresponding to at least one heat source. The ceramic layer is an outer surface of the handheld electronic device and exposed to an external environment. The titanium metal layer or the stainless steel metal layer faces a receiving space of the handheld electronic device in contact with the heat source in the receiving space. The titanium metal layer or the stainless steel metal layer serves to absorb the heat generated by the heat source and transfer the heat to the ceramic layer. Then the heat is transferred to the external environment to heat-exchange with the external environment for dissipating the heat.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1A:
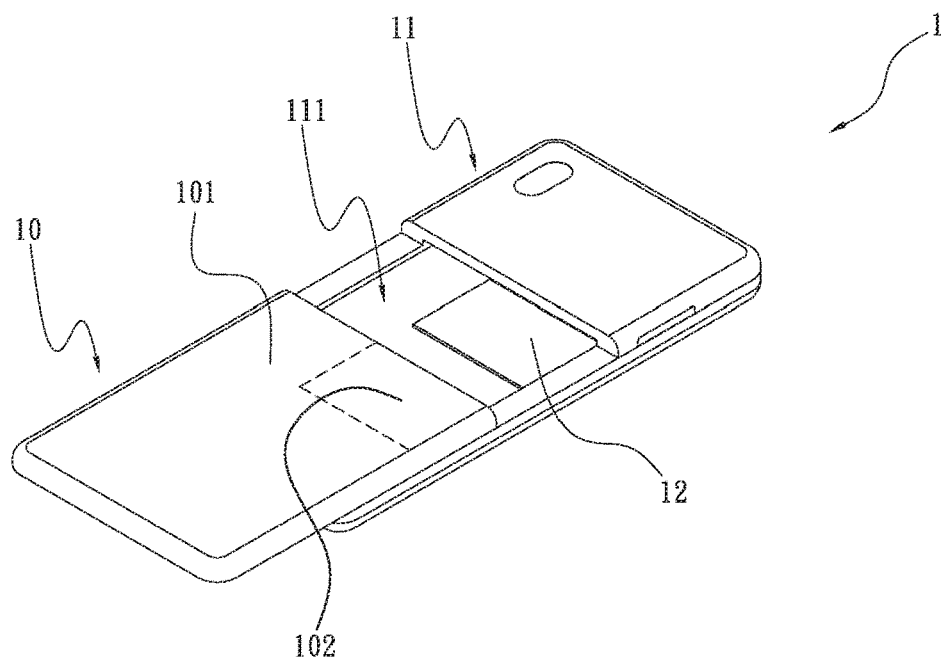
FIG. 1A is a perspective exploded view of a first embodiment of the case heat dissipation unit of handheld electronic device of the present invention.
Figure 1B:
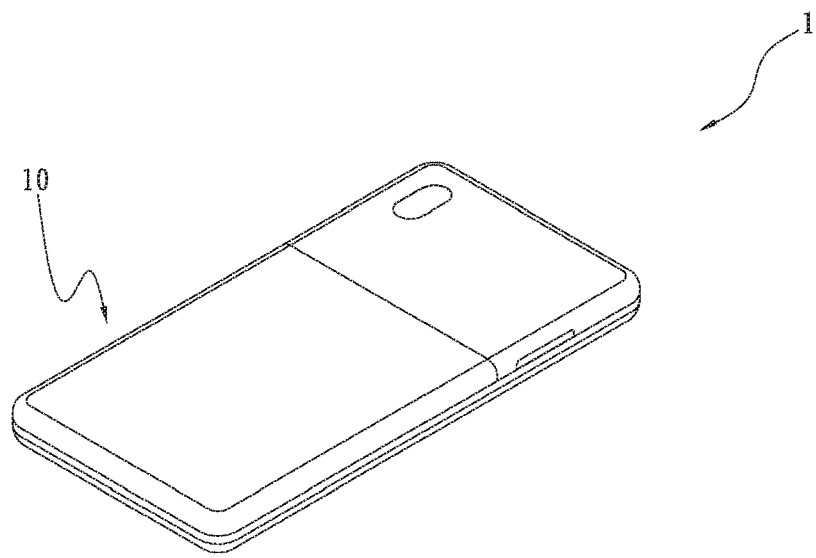
FIG. 1B is a perspective assembled view of the first embodiment of the case heat dissipation unit of handheld electronic device of the present invention.
Figure 1C:
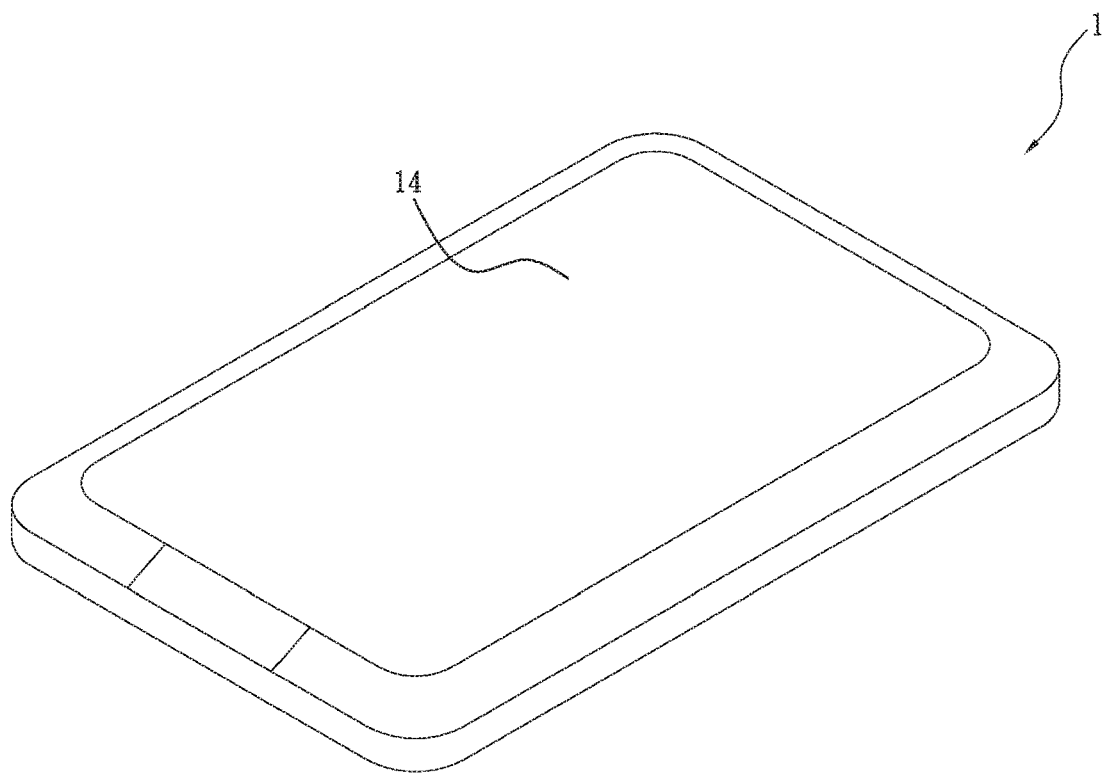
FIG. 1C is a perspective view of the first embodiment of the case heat dissipation unit of handheld electronic device of the present invention.
Figure 1D:
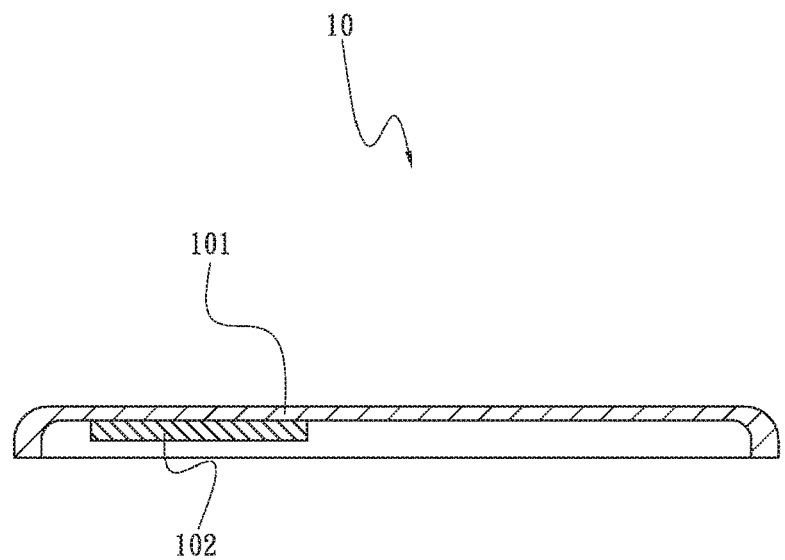
FIG. 1D is a sectional view of the back cover of the case heat dissipation unit of handheld electronic device of the present invention.
Figure 1E:
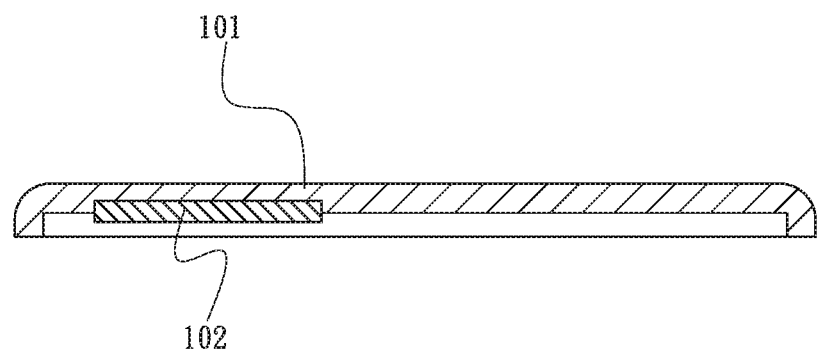
FIG. 1E is a sectional view of another embodiment of the back cover of the case heat dissipation unit of handheld electronic device of the present invention.
Figure 2:
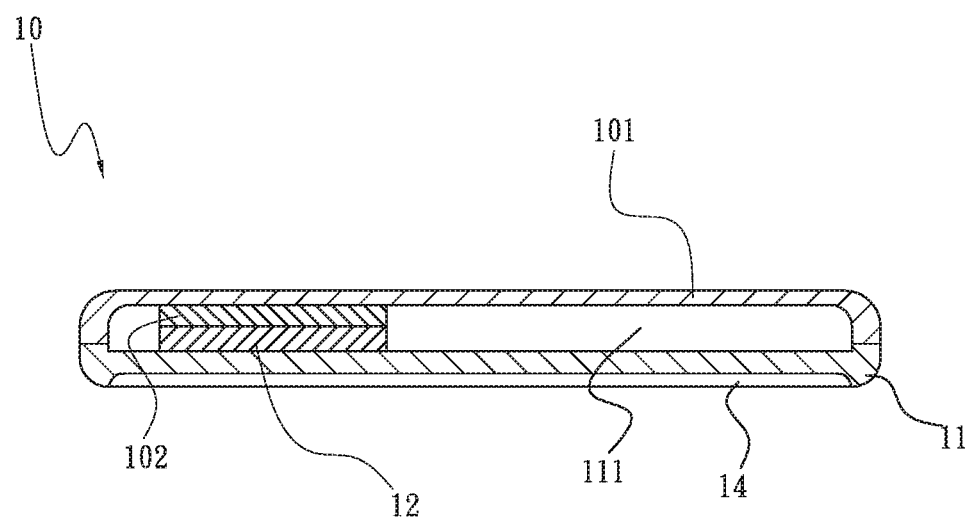
FIG. 2 is a sectional view showing an application of the case heat dissipation unit of handheld electronic device of the present invention.
Figure 3:
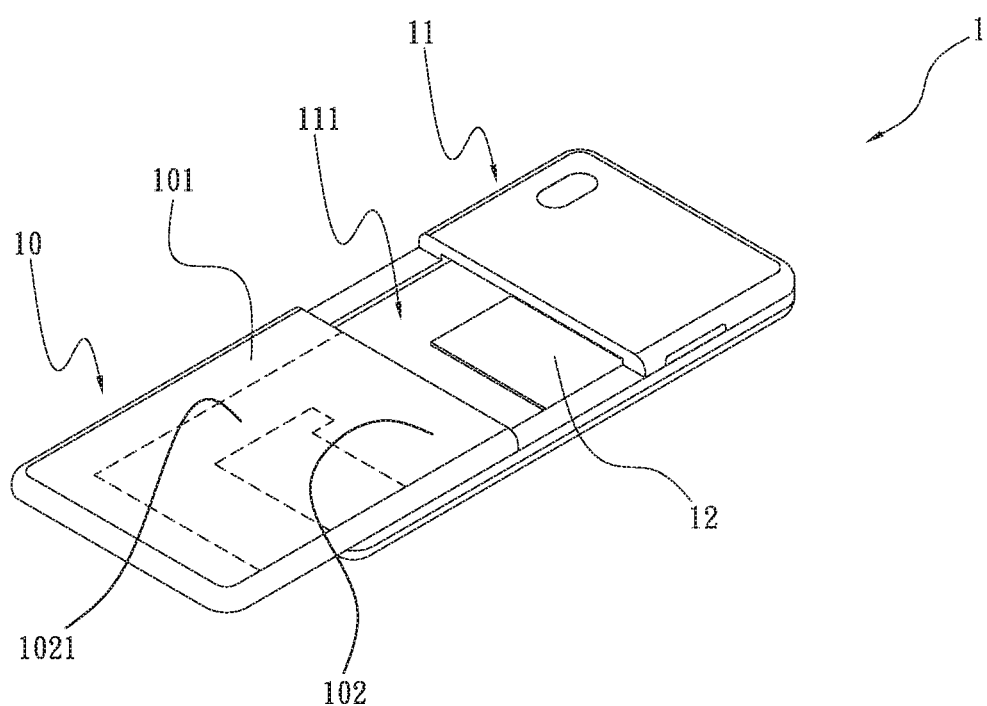
FIG. 3 is a sectional view showing another application of the case heat dissipation unit of handheld electronic device of the present invention.

Please refer to FIGS. 1A, 1B, 1C, 1D and 1E. FIG. 1A is a perspective exploded view of a first embodiment of the case heat dissipation unit of handheld electronic device of the present invention. FIG. 1B is a perspective assembled view of the first embodiment of the case heat dissipation unit of handheld electronic device of the present invention. FIG. 1C is a perspective view of the first embodiment of the case heat dissipation unit of handheld electronic device of the present invention. FIG. 1D is a sectional view of the back cover of the case heat dissipation unit of handheld electronic device of the present invention. FIG. 1E is a sectional view of another embodiment of the back cover of the case heat dissipation unit of handheld electronic device of the present invention. According to the first embodiment, the case heat dissipation unit of handheld electronic device of the present invention is cooperatively assembled with a handheld electronic device 1. The case heat dissipation unit includes a back cover 10 including a ceramic layer 101. A titanium metal layer 102 is, but not limited to, disposed on the ceramic layer 101 in a position corresponding to at least one heat source 12. In a modified embodiment, the titanium metal layer 102 can be replaced with a stainless steel metal layer 102. The ceramic layer 101 is made of ceramic material and has the features of high temperature resistance, low thermal expansion coefficient, etc. The titanium metal layer 102 includes pure titanium (such as commercial pure titanium or industrial pure titanium) or titanium alloy. The local titanium metal layer or stainless steel metal layer 102 is such as a titanium metal sheet or a stainless steel metal sheet with the features of metal strength and heat conductivity. The titanium metal layer or stainless steel metal layer 102 is bonded with the ceramic layer 101 by means of adhesion and/or inlaying. In this embodiment, the titanium metal layer or stainless steel metal layer 102 is disposed on one face of the ceramic layer 101 and overlaid on the surface of the face of the ceramic layer 101. The area of the titanium metal layer or stainless steel metal layer 102 is smaller than the area of the surface of the face of the ceramic layer 101. Alternatively, the titanium metal layer or stainless steel metal layer 102 has a hollow to avoid the antenna. In another embodiment, the titanium metal layer or stainless steel metal layer 102 is disposed in a position corresponding to the heat source 12 and locally stacked on the surface of the face of the ceramic layer 101. That is, a small area of the ceramic layer 101 is bonded with the titanium metal layer or stainless steel metal layer 102. Therefore, the titanium metal layer or stainless steel metal layer 102 will not affect the layout of the antenna structure and signal receiving ability of the antenna. In still another embodiment, the titanium metal layer or stainless steel metal layer 102 corresponding to the heat source 12 has at least one extension section 1021 extending to a position distal from the heat source 12 for conducting heat to a section of the ceramic layer 101, which is cooler than the heat source 12 for dissipating the heat (as shown in FIG. 3).

The handheld electronic device 1 can be a cellular phone or a tablet or a tablet computer. The handheld electronic device 1 has a case 11. One face of the case 11 defines a receiving space 111. A screen 14 such as a touch screen is disposed on the other face of the handheld electronic device 1. At least one side of the receiving space 111 is an open side. The heat source 12 is received in the receiving space 111. The back cover 10 is correspondingly mated with the open side to close the receiving space 111, whereby the titanium metal layer or stainless steel metal layer 102 is correspondingly disposed in the receiving space 111 in contact with the heat source 12. The ceramic layer 101 of the back cover 10 is exposed to an external environment. Therefore, the heat of the heat source 12 of the handheld electronic device 1 is transferred from the titanium metal layer/stainless steel metal layer 102 to the ceramic layer 101 by way of heat conduction and then transferred to the external environment to heat-exchange with the external environment for dissipating the heat. Accordingly, the heat of the heat source 12 can be dissipated to prolong the lifetime of the handheld electronic device 1.

In conclusion, in comparison with the conventional device, the present invention has the following advantages:

1. The heat can be quickly conducted to outer side.
2. The lifetime of the handheld electronic device is prolonged.
3. The titanium metal layer/stainless steel metal layer 102 is locally stacked on the ceramic layer 101 of the back cover 10. The titanium metal layer/stainless steel metal layer 102 will not affect the layout of the antenna structure and the signal receiving ability of the antenna. In addition, the titanium metal layer/stainless steel metal layer 102 serves to enhance the impact-resistance of the ceramic layer 101.

The present invention has been described with the above embodiments thereof and it is understood that many changes and modifications in such as the form or layout pattern or practicing step of the above embodiments can be carried out without departing from the scope and the spirit of the invention that is intended to be limited only by the appended claims.

What is claimed is:

1. A case heat dissipation unit for a handheld electronic device, comprising a back cover for assembling to a case of a handheld electronic device, the case defining a receiving space covered by a front face having a touch screen provided thereon, the back cover closing the receiving space and including an outer ceramic layer, and one of a titanium and a stainless steel inner layer being disposed on the ceramic layer and including a first portion in a position overlaying at least one heat source and a second portion extending away from the at least once heat source, the ceramic layer being an outer surface of the back cover of the handheld electronic device and exposed to an external environment, the one of a titanium and the stainless steel layer overlaying the receiving space of the handheld electronic device and in with the first portion in contact with the heat source in the receiving space, the one of the titanium and the stainless steel layer serving to conduct the heat generated by the heat source to the ceramic layer for dissipating the heat;

wherein only a predetermined area of the ceramic layer corresponding to the first and second portion of the titanium layer and stainless steel layer are shaped, so that the one of the titanium layer and stainless steel layer will not adversely affect operation of an antenna structure contained within said case.

2. The case heat dissipation unit of handheld electronic device as claimed in claim 1, wherein at least one side of the receiving space is an open side, the back cover being correspondingly mated with the open side to close the receiving space.

3. The case heat dissipation unit of handheld electronic device as claimed in claim 1, wherein when the inner layer is a titanium layer and includes pure titanium or a titanium alloy.

4. The case heat dissipation unit of handheld electronic device as claimed in claim 1, wherein the ceramic layer and the one of the titanium and stainless steel inner layer are bonded to one another in a stacked relation.

* * * * *